United States Patent
Katsuno et al.

(10) Patent No.: US 7,602,434 B2
(45) Date of Patent: Oct. 13, 2009

(54) SOLID-STATE IMAGING DEVICE

(75) Inventors: Motonari Katsuno, Kyoto (JP); Ryouhei Miyagawa, Mukou (JP)

(73) Assignee: Panasonic Corporation, Osaka (JP)

( * ) Notice: Subject to any disclaimer, the term of this patent is extended or adjusted under 35 U.S.C. 154(b) by 548 days.

(21) Appl. No.: 11/360,494

(22) Filed: Feb. 24, 2006

(65) Prior Publication Data
US 2006/0192883 A1    Aug. 31, 2006

(30) Foreign Application Priority Data
Feb. 25, 2005    (JP)    ............... 2005-050436

(51) Int. Cl.
*H04N 5/225*    (2006.01)
(52) U.S. Cl. .................. 348/340; 348/335
(58) Field of Classification Search ......... 348/262–324, 348/340–341, 335; 257/294, 432; 250/208.1–208.6; 358/513–526
See application file for complete search history.

(56) References Cited

U.S. PATENT DOCUMENTS

| | | | | |
|---|---|---|---|---|
| 4,905,033 | A * | 2/1990 | Ishida et al. ................... | 396/96 |
| 6,674,470 | B1 * | 1/2004 | Tanaka et al. ................ | 348/302 |
| 6,747,699 | B2 * | 6/2004 | Ohzu et al. ................... | 348/294 |
| 6,900,480 | B2 * | 5/2005 | Sugiyama ..................... | 257/222 |
| 7,019,373 | B2 * | 3/2006 | Hashimoto ................... | 257/432 |
| 7,084,443 | B2 * | 8/2006 | Kitano et al. ................ | 257/291 |
| 7,138,618 | B2 * | 11/2006 | Mishina et al. ........... | 250/208.1 |
| 7,230,288 | B2 * | 6/2007 | Yamane et al. .............. | 257/222 |
| 7,250,973 | B2 * | 7/2007 | Dobashi et al. ............. | 348/340 |
| 7,283,305 | B2 * | 10/2007 | Okita et al. .................. | 359/619 |
| 7,297,919 | B2 * | 11/2007 | Mishina et al. ........... | 250/208.1 |
| 7,393,715 | B2 * | 7/2008 | Tazoe et al. .................... | 438/57 |
| 2001/0026322 | A1 * | 10/2001 | Takahashi et al. ........... | 348/340 |
| 2004/0004668 | A1 * | 1/2004 | Namazue et al. ............ | 348/340 |
| 2005/0035377 | A1 | 2/2005 | Kamimura et al. | |
| 2005/0174552 | A1 * | 8/2005 | Takada et al. .................. | 355/53 |
| 2005/0253943 | A1 * | 11/2005 | Takahashi et al. ........... | 348/294 |

(Continued)

FOREIGN PATENT DOCUMENTS

JP        1-213079 A      8/1989

(Continued)

*Primary Examiner*—Tuan V Ho
*Assistant Examiner*—Don Nguyen
(74) *Attorney, Agent, or Firm*—McDermott Will & Emery LLP

(57) ABSTRACT

A solid-state imaging device has a plurality of photoelectric conversion elements two dimensionally arrayed in an imaging area, a light shielding film that regulates the amount of external light incident on the photoelectric conversion elements by a wiring pattern, a wiring layer placed between the light shielding film and the photoelectric conversion elements, and a plurality of contacts electrically connecting the light shielding film with the wiring layer in a lamination direction. The shape of the light shielding film is defined by a plurality of first figures overlapping with a second figure, each first figure being placed over a different contact in plan view, and the second figure having a plurality of apertures each corresponding to a different photoelectric conversion element. The center of each aperture in the second figure is displaced further from the center of a corresponding photoelectric conversion element toward the middle of the imaging area in plan view, as distance from the middle of the imaging area increases. Furthermore, a positional relation of the first figures with the second figure differs depending on location in the imaging area.

9 Claims, 10 Drawing Sheets

U.S. PATENT DOCUMENTS

2008/0079828 A1* 4/2008 Izawa .................. 348/294

FOREIGN PATENT DOCUMENTS

| | | |
|---|---|---|
| JP | 2600250 B2 | 4/1997 |
| JP | 10-150182 | 6/1998 |
| JP | 2001-237404 A | 8/2001 |
| JP | 2003-46865 | 2/2003 |
| JP | 3430071 B2 | 5/2003 |

* cited by examiner

1

— PRIOR ART —

— *PRIOR ART* —

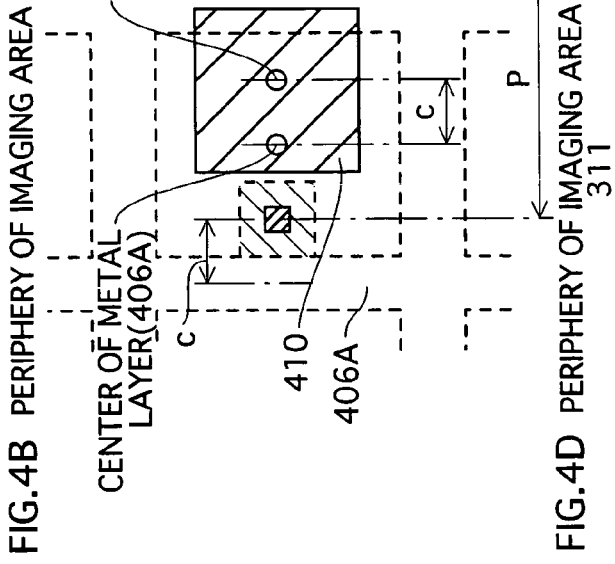
FIG.4A MIDDLE OF IMAGING AREA
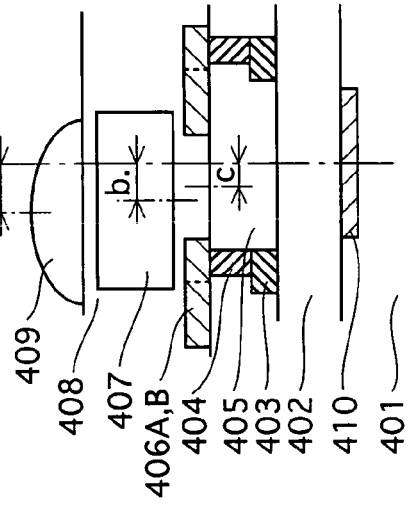
FIG.4B PERIPHERY OF IMAGING AREA
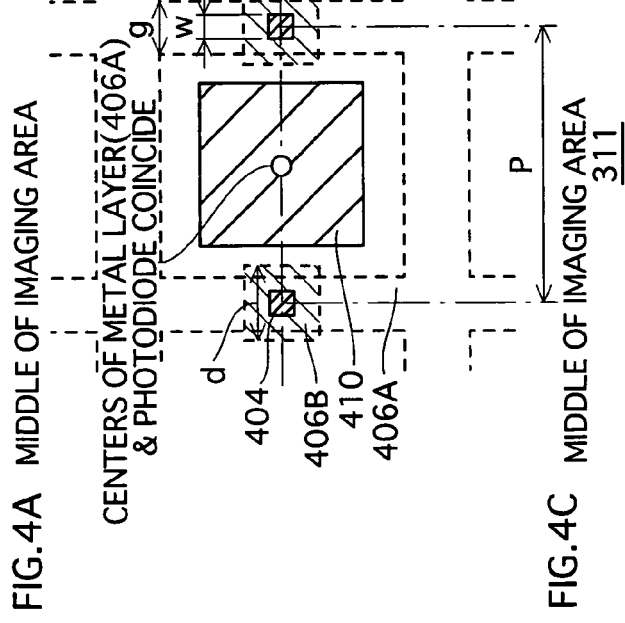
FIG.4C MIDDLE OF IMAGING AREA
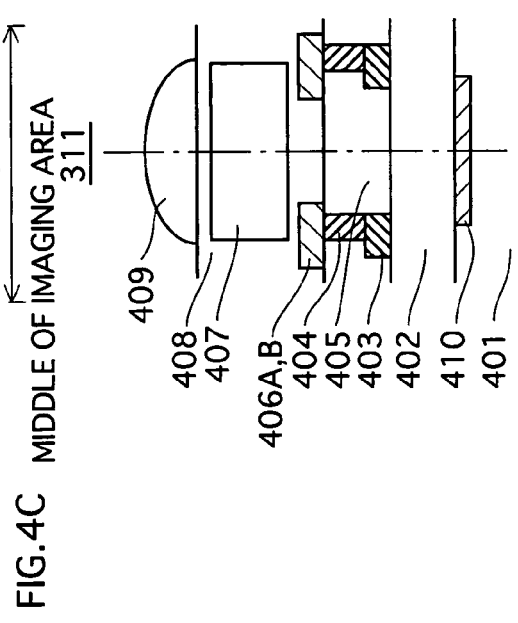
FIG.4D PERIPHERY OF IMAGING AREA

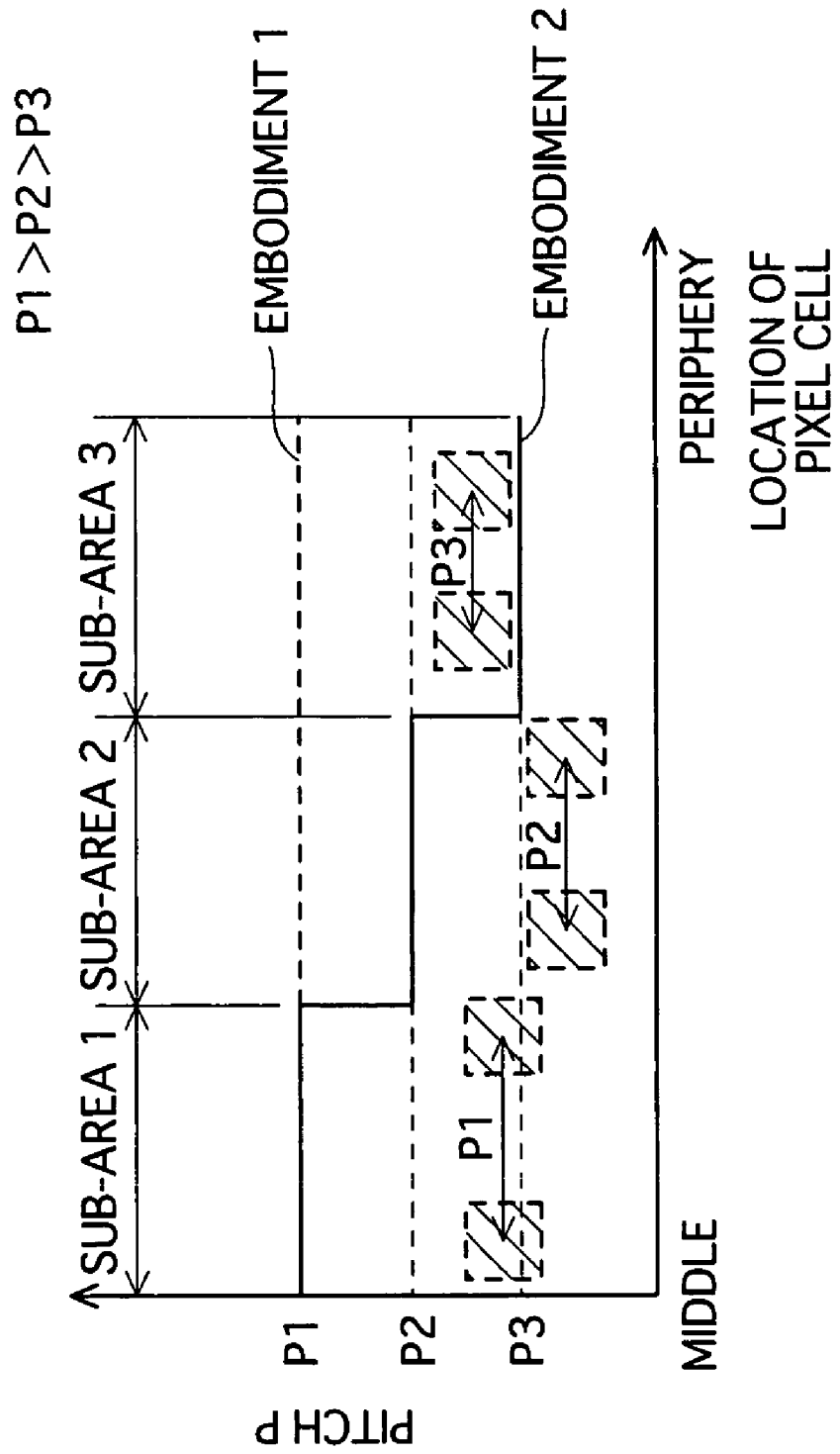

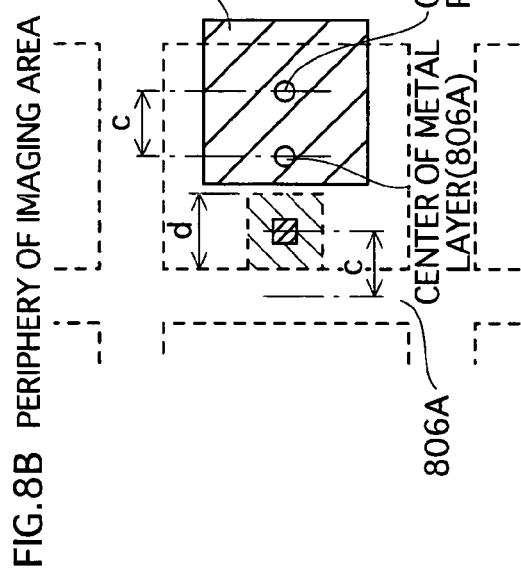
FIG.8A MIDDLE OF IMAGING AREA
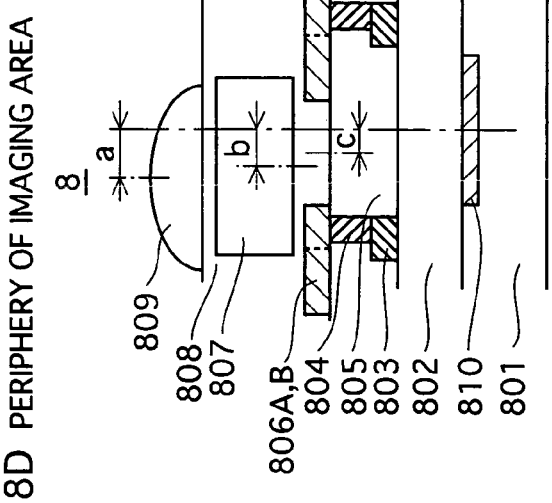
FIG.8B PERIPHERY OF IMAGING AREA
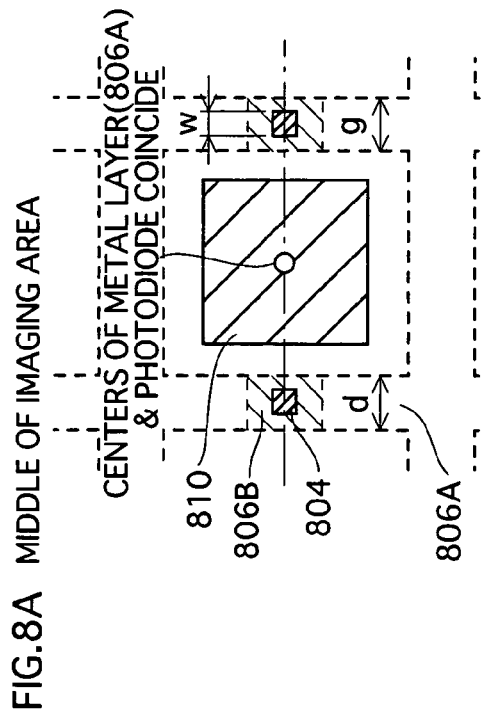
FIG.8C MIDDLE OF IMAGING AREA
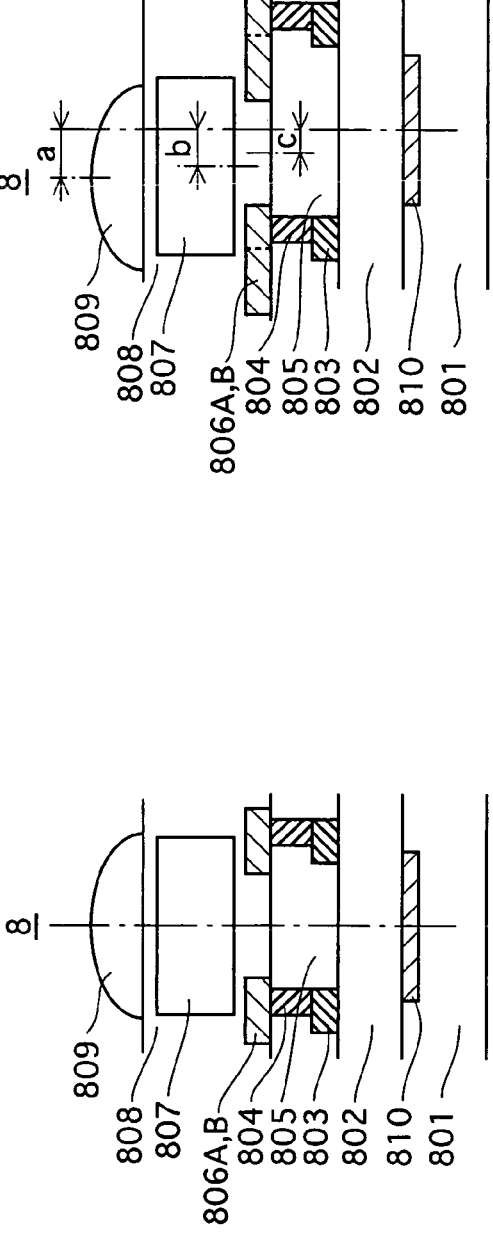
FIG.8D PERIPHERY OF IMAGING AREA ly marked.

SOLID-STATE IMAGING DEVICE

CROSS-REFERENCE TO RELATED APPLICATIONS

This application is based on application no. 2005-050436 filed in Japan, the content of which is hereby incorporated by reference.

BACKGROUND OF INVENTION

1. Field of the Invention

The present invention relates to a solid-state imaging device, and more particularly to technology for reducing sensitivity shading.

2. Related Art

Solid-state imaging devices, remarkably popularized in recent years, typically receive external light via an optical lens.

FIG. 1 is a cross-sectional view of a digital camera illustrating the optical path of external light incident on a solid-state imaging device via an optical lens. As shown in FIG. 1, digital camera 1 is provided with an optical lens 101 and a solid-state imaging device 102, and external light 111 to 113 is incident on solid-state imaging device 102 via optical lens 101.

External light 112 indicated by the solid line is incident substantially at the middle of the imaging area of solid-state imaging device 102. In this case, the chief ray of external light 112 substantially coincides with the optical axis of optical lens 101, and is incident substantially vertically on the imaging area. In other words, the angle of incidence of external light 112 is zero.

On the other hand, external light 111 indicated by the broken line and external light 113 indicated by the dash-dotted line are, as shown in FIG. 1, incident at an angle at the periphery of the imaging area. In this case, the angle of incidence of the external light increases as the position of incidence moves away from the middle of the imaging area.

This produces a difference in light reception efficiency between pixel cells in the middle of the imaging area and pixel cells at the periphery, resulting in sensitivity shading. FIG. 2 is a cross-sectional view showing the structure of a typical pixel cell. As shown in FIG. 2, pixel cell 2 is provided with a semiconductor substrate 201, insulating films 202, 205 and 208, metal layers 203 and 206, a contact 204, a color filter 207, a collecting lens 209, and a photodiode 210 (see Japanese patent application publications No. 10-150182, and No. 2003-46865, for example).

External light incident on pixel cell 2 is incident on photodiode 210 via color filter 207 after having been focused by collecting lens 209. In this case, the external light must pass through metal layers 203 and 206 and the aperture of contact 204. However, when the angle of incidence is large, the incident light is shaded by metal layers 203 and 206 and contact 204. The incident light thus has difficulty reaching photodiode 210, resulting in sensitivity shading.

Metal oxide semiconductor (MOS) image sensors and charge coupled devices (CCDs) are known solid-state imaging devices. MOS image sensors are provided with a MOS-FET per pixel cell for amplifying the output charge of the photodiode, and thus require a plurality of metal wiring layers. Since this lengthens the optical path from collecting lens 209 to photodiode 210, sensitivity shading is particularly marked.

SUMMARY OF INVENTION

The present invention, arrived at in view of the above problem, aims to provide a solid-state imaging device that realizes high image quality by reducing sensitivity shading.

To solve the above problem, a solid-state imaging device pertaining to the present invention includes a plurality of photoelectric conversion elements two dimensionally arrayed in an imaging area, a light shielding film that regulates the amount of external light incident on the photoelectric conversion elements by a wiring pattern, a wiring layer placed between the light shielding film and the photoelectric conversion elements in a lamination direction, and a plurality of contacts electrically connecting the light shielding film with the wiring layer. The shape of the light shielding film is defined by a plurality of first figures overlapping with a second figure, each first figure being placed over a different contact in plan view, and the second figure having a plurality of apertures each corresponding to a different photoelectric conversion element. The center of each aperture in the second figure is displaced further from the center of a corresponding photoelectric conversion element toward the middle of the imaging area in plan view, as distance from the middle of the imaging area increases, and a positional relation of the first figures with the second figure differs depending on location in the imaging area.

This structure enables sensitivity shading to be reduced by ensuring a sufficient amount of received light even at the periphery of the imaging area, since the second figure portion can be significantly shifted toward the middle of the imaging area, while at the same time ensuring electrical connectivity of the light shielding film with the wiring layer in the first figure portion. Accordingly, high image quality can be realized.

Furthermore, the displacement of each aperture center from the center of a corresponding photoelectric conversion element may increase in proportion to distance from the middle of the imaging area.

This structure enables the distance between the aperture centers of the second figure and the centers of corresponding photoelectric conversion elements to be optimally adjusted according to the angle of incidence of external light, since the angle of incidence of external light on the imaging area increases as distance from the middle of the imaging area increases.

Furthermore, the displacement of each aperture center from the center of a corresponding photoelectric conversion element may increase stepwise according to distance from the middle of the imaging area.

This structure enables the trouble of designing the second figure to be eliminated, since the angles of incidence of external light are similar at positions close to one another in the imaging area, with the change in the angle of incidence being small particularly at the periphery of the imaging area. Accordingly, solid-state imaging devices with reduced sensitivity shading can be designed more cost effectively.

Furthermore, the first figures may have substantially similar positional relations with corresponding contacts regardless of location in the imaging area, may be substantially similar in size regardless of location in the imaging area, and may be large enough to overlap with the second figure at a furthest location from the middle of the imaging area.

This structure enables the trouble of designing the second figure to be eliminated, while at the same time ensuring electrical connectivity between the light shielding film and the wiring layer.

Furthermore, the interval between adjacent first figures interposed with a photoelectric conversion element in plan view may increase as distance from the middle of the imaging area increases.

This structure enables sensitivity shading to be reduced by reducing the amount of incident light shaded by the first figure portion of the light shielding film.

In this case, by dividing the imaging area into a plurality of sub-areas, and making the interval between adjacent first figures in respective sub-areas constant, the trouble of designing such solid-state imaging devices can be lessened.

Furthermore, each first figure may increase in size as distance from the middle of the imaging area increases.

This structure enables light reception efficiency in the middle of the imaging area to be improved, since the first figures are made smaller as distance between the second figure and the contacts is reduced toward the middle of the imaging area.

Furthermore, the pattern width of each first figure in the middle of the imaging area maybe equivalent to the pattern width of the second figure, in a pattern widthwise direction of the second figure near a contact corresponding to the first figure.

This structure enables the amount of incident light shaded by the first figure portion of the light shielding film to be reduced, while at the same time maintaining a processing margin necessary for ensuring electrical connectivity between the first figures and the contacts.

Furthermore, the imaging area may be rectangular, and each first figure may be placed adjacent to a closest photoelectric conversion element in the short direction of the imaging area.

This structure enables sensitivity shading at the periphery of the imaging area to be reduced.

According to the present invention, a high performance, high-reliability solid-state imaging device is obtained that can suppress sensitivity shading by reducing the amount of shading around pixel arrays, and provide excellent connectivity between lower and upper layer wiring.

Furthermore, this solid-state imaging device can be manufactured using processes similar to a conventional structure, thereby removing the need for additional manufacturing processes, which is advantageous in terms of cost.

BRIEF DESCRIPTION OF DRAWINGS

These and other objects, advantages, and features of the invention will become apparent from the following description thereof taken in conjunction with the accompanying drawings, which illustrate specific embodiments of the present invention.

In the drawings:

FIGS. 4A to 4D show the structure of a pixel cell 311 pertaining to embodiment 1 of the present invention, FIGS. 4A and 4C being a plan view and a cross-sectional view of pixel cell 311 located in the middle of an imaging area 310, and FIGS. 4B and 4D being a plan view and a cross-sectional view of pixel cell 311 located at the periphery of imaging area 310;

FIG. 7 is a graph illustrating the pitch of the metal layers per sub-area in the case of FIG. 6A pertaining to embodiment 2 of the present invention;

FIGS. 8A to 8D show the structure of a pixel cell provided in a MOS image sensor pertaining to an embodiment 3 of the present invention, FIGS. 8A and 8C being a plan view and a cross-sectional view of the pixel cell located in the middle of an imaging area, and FIGS. 8B and 8D being a plan view and a cross-sectional view of the pixel cell located at the periphery of the imaging area;

DETAILED DESCRIPTION OF PREFERRED EMBODIMENTS

Embodiments of a solid-state imaging device pertaining to the present invention are described below with reference to the drawings, taking a MOS image sensor as an example.

Embodiment 1

A MOS image sensor pertaining to an embodiment 1 of the present invention is characterized in that the position and shape of a metal layer in each pixel cell varies depending on the location of the pixel cell in an imaging area, so as to increase the amount of external light incident on a photodiode.

(1) Structure of MOS Image Sensor

Figure 1:
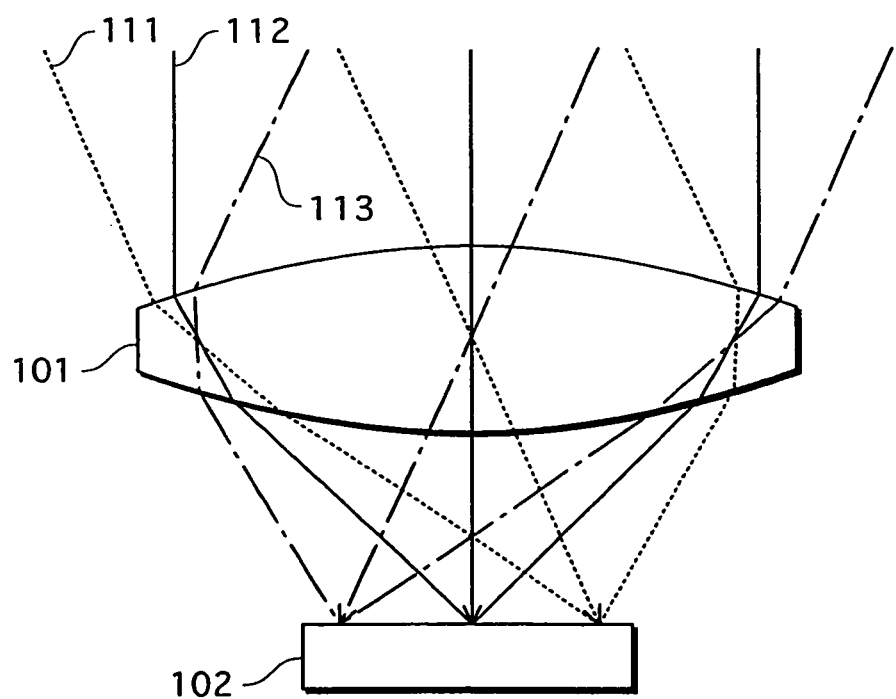
FIG. 1 is a cross-sectional view of a digital camera illustrating the optical path of external light incident on a solid-state imaging device via an optical lens.
Figure 2:
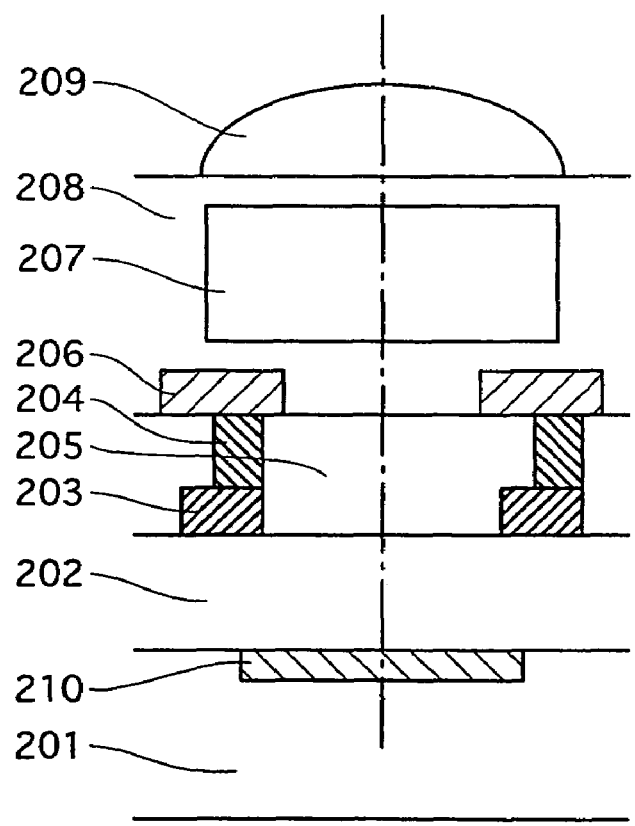
FIG. 2 is a cross-sectional view showing the structure of a typical pixel cell.
Figure 3:
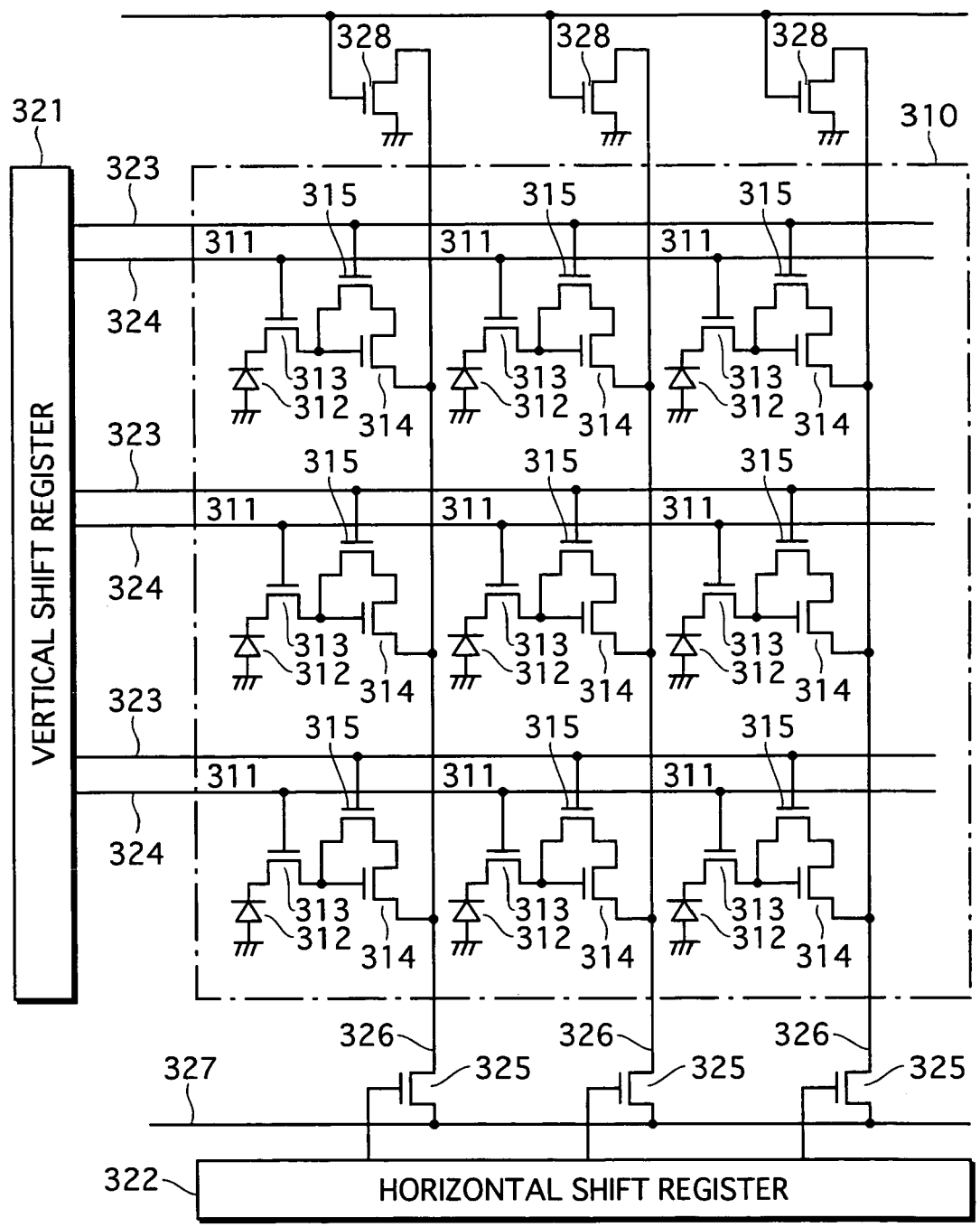
FIG. 3 is a circuit diagram showing a main structure of a MOS image sensor pertaining to an embodiment 1 of the present invention.

Firstly, the structure of a MOS image sensor pertaining to the present embodiment is described. FIG. 3 is a circuit diagram showing the main structure of a MOS image sensor pertaining to the present embodiment.

As shown in FIG. 3, MOS image sensor 3 is provided with an imaging area 310, a vertical shift register 321, a horizontal shift register 322, reset lines 323, horizontal pixel selection lines 324, vertical selection transistors 325, a horizontal signal line 327, and vertical voltage input transistors 328.

A large number of pixel cells are two dimensionally arrayed in imaging area 310. Individual pixel cells 311 are provided with a photodiode 312, a charge transfer transistor 313, a reset transistor 314, and an amplifying transistor 315.

(2) Structure of Pixel Cell 311

Next, the structure of pixel cell 311 is described. FIGS. 4A to 4D show the structure of pixel cell 311 pertaining to the present embodiment. FIGS. 4A and 4C are a plan view and a cross-sectional view of pixel cell 311 located in the middle of imaging area 310, while FIGS. 4B and 4D are a plan view and a cross-sectional view of pixel cell 311 located at the periphery of imaging area 310.

As shown in FIGS. 4C and 4D, each pixel cell 311 is provided with a semiconductor substrate 401, insulating films 402, 405 and 408, metal layers 403, 406A and 406B, a contact 404, a color filter 407, a collecting lens 409, and a photodiode 410.

Note that although metal layers 406A and 406B are distinguished as different figures when designing MOS image sensor 3, they form a single metal layer in MOS image sensor 3 after manufacture.

Photodiode 410 is formed in semiconductor substrate 401, and on top of this are sequentially formed insulating films 402 and 405, metal layer 403, contact 404, insulating film 408, metal layers 406A and 406B, color filter 407, and collecting lens 409. Contact 404 electrically connects metal layer 403 with metal layers 406A and 406B.

Metal layers 403, 406A and 406B function as wiring that electrically connects elements or circuits within MOS image sensor 3.

(3) Reduction of Sensitivity Shading

In the present embodiment, metal layer 406A functions primarily as a light shielding film. The center of metal layer 406A in the middle of imaging area 310 substantially coincides with the center of photodiode 410 in plan view (FIG. 4A). On the other hand, the center of metal layer 406A at the periphery of imaging area 310 is displaced from the center of photodiode 410 toward the middle of imaging area 310 in plan view (FIG. 4B).

This enables sensitivity shading to be reduced by preventing metal layer 406A from shading external light.

Note that the centers of color filter 407 and collecting lens 409 at the periphery of imaging area 310 are also displaced from the center of photodiode 410 toward the middle of imaging area 310 in plan view, so that an appropriate amount of external light is incident on photodiode 410. The displacement from the center of photodiode 410 increases in order of metal layer 406A, color filter 407 and collecting lens 409 (FIG. 4D).

(4) Ensuring Electrical Connectivity

Note that since the positional relation between photodiode 410 and metal layer 403 remains constant regardless of the location of pixel cell 311 in imaging area 310, the positional deviation between metal layer 403 and metal layer 406A increases as pixel cell 311 is located further from the middle of imaging area 310 toward the periphery, until finally the centers of metal layers 403 and 406A fail to overlap at all in plan view, as shown in FIG. 4B.

In the present embodiment, metal layer 406B is provided to ensure electrical connectivity between metal layer 403 and metal layer 406A. Metal layer 406B is placed so that the center of metal layer 406B coincides with the center of contact 404 in plan view, regardless of the location of pixel cell 311 in imaging area 310. Thus, the placement pitch of metal layers 403 and 406B and contact 404 is equivalent to that of pixel cells 311 in imaging area 310.

The size and shape of metal layer 406B is designed to ensure electrical connectivity with metal layer 403 even when the centers of metal layer 403 and metal layer 406A are at maximum displacement.

(5) Placement of Metal Layers 406A and 406B

Figure 5A:
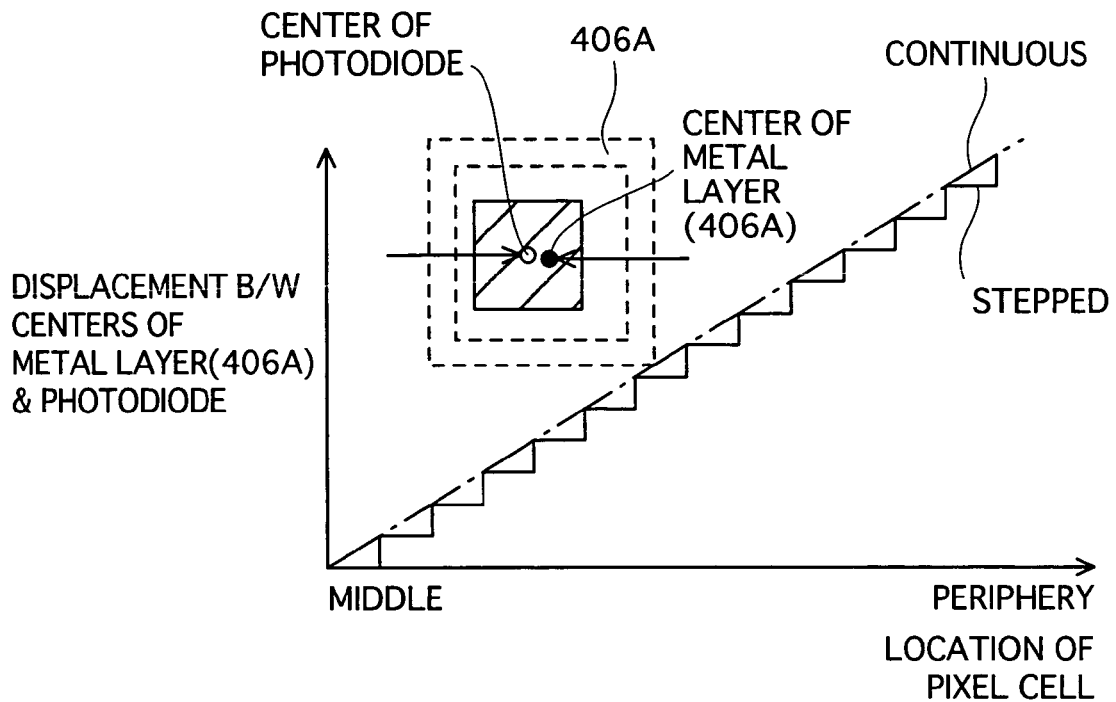
FIGS. 5A and 5B show the relation between the location of pixel cell 311 in imaging area 310 and the placement of metal layers 406A and 406B pertaining to embodiment 1 of the present invention, FIG. 5A being a graph showing the displacement between the centers of metal layer 406A and a photodiode 410, and FIG. 5B being a graph showing the pitch between a pair of metal layers 406B sandwiching photodiode 410.
Figure 5B:
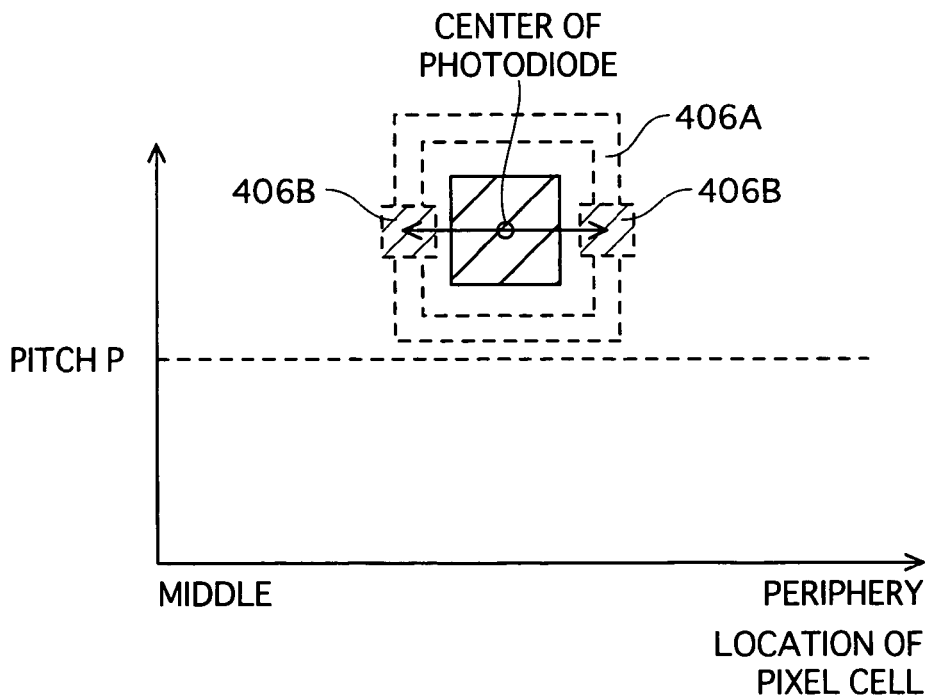

Next, the placement of metal layers 406A and 406B is further described in detail. FIGS. 5A and 5B show the relation between the location of pixel cell 311 in imaging area 310 and the placement of metal layers 406A and 406B. FIG. 5A is a graph showing the displacement between the centers of metal layer 406A and photodiode 410, while FIG. 5B is a graph showing the pitch between a pair of metal layers 406B sandwiching photodiode 410.

The displacement between the centers of metal layer 406A and photodiode 410 increases stepwise as the location of pixel cell 311 moves further from the middle of imaging area 310 toward the periphery.

Similarly increasing the displacement between pixel cells 311 stepwise according to distance from the middle of imaging area 310 has the advantage of facilitating design. However, the variation in brightness between adjacent pixel cells 311 increases when the displacement between adjacent pixel cells 311 fluctuates greatly. In view of this, the ideal is to optimize the displacement per pixel cell according to distance from the middle of imaging area 310, or in other words, to change the displacement continuously.

On the other hand, the pitch of metal layers 406A remains constant regardless of the location of pixel cell 311 in imaging area 310, given the necessity of ensuring electrical connectivity with contact 404.

(6) Size of Metal Layers 406A and 406B

Next, the size of metal layers 406A and 406B is described in detail. As shown in FIGS. 4A to 4D, metal layer 406A is lattice-shaped in plan view, while metal layers 406B and contacts 404 are all square-shaped in plan view.

In this case, a pattern width d of metal layer 406B is calculated using the following equation, where g is the pattern width of metal layer 406A, $c_{max}$ is the maximum displacement between the centers of metal layer 406A and photodiode 410, w is the pattern width of contact 404.

$$d = w + c_{max} - (g/2) \tag{1}$$

For example, if g is set from 1.0 μm to 3.0 μm, $c_{max}$ is set from 0.4 μm to 1.0 μm, and w is set from 0.1 μm to 0.4 μm, d will be approximately 0.5 μm to 2.0 μm.

If the centers of metal layer 406A and photodiode 410 are aligned regardless of the location of pixel cell 311 in imaging area 310, sensitivity shading occurs whereby light detected at the periphery drops to 60% or less of that detected in the middle, when originally the same amount should be detected regardless of location in imaging area 310. In contrast, the present embodiment enables the amount of light detected at the periphery to be improved to 70% to 90% of that detected in the middle.

Embodiment 2

A MOS image sensor pertaining to the present embodiment is provided with generally the same structure as a MOS image sensor pertaining to embodiment 1, except that the pitch of the metal layers for ensuring electrical connectivity (equivalent to metal layers 406B in embodiment 1) differs depending on location in the imaging area. The present embodiment is described below, focusing exclusively on this difference.

(1) Division of Imaging Area

In the present embodiment, the imaging area is divided into a plurality of sub-areas, with the pitch of the metal layers for ensuring electrical connectivity being the same within respective sub-areas. This pitch becomes smaller the further the sub-area is from the middle of the imaging area.

Figure 6A:
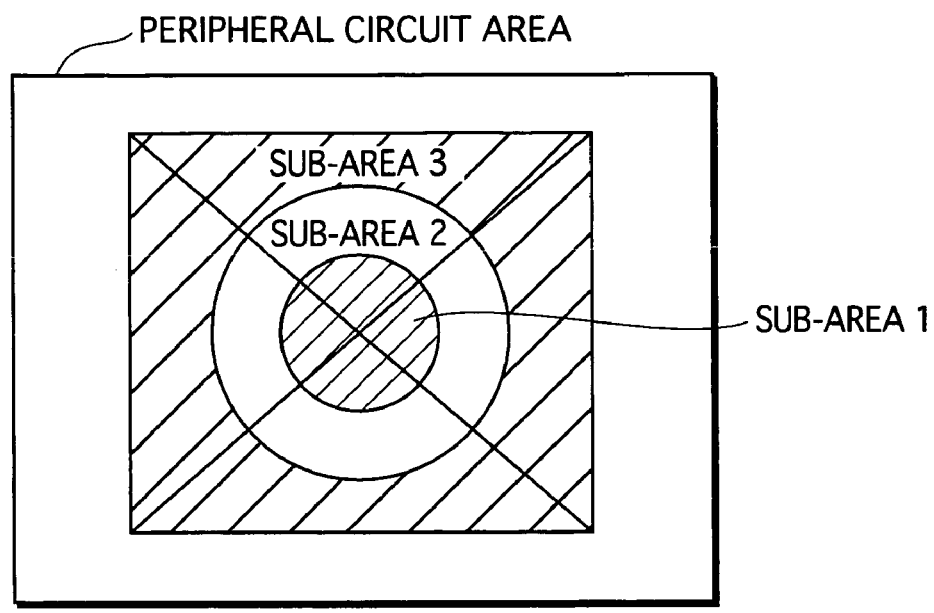
FIGS. 6A and 6B are schematic views showing an exemplary division of an imaging area pertaining to an embodiment 2 of the present invention, FIG. 6A showing an example of the imaging area divided by concentric circles centered on the middle of the imaging area, and FIG. 6B showing an example of the imaging area divided by rectangles centered on the middle of the imaging area and similar in shape to the external form of the imaging area.
Figure 6B:
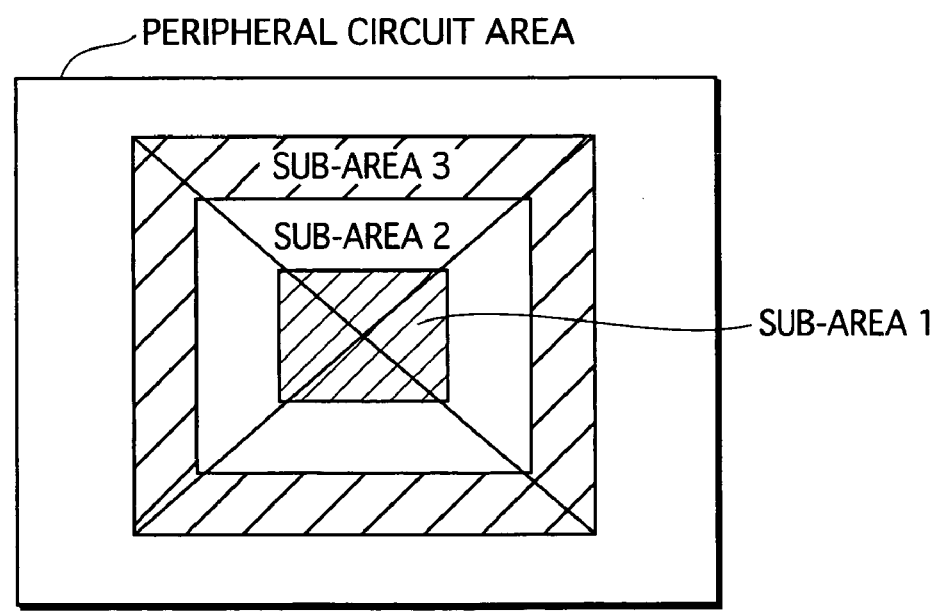

FIGS. 6A and 6B are schematic views showing an exemplary division of the imaging area. FIG. 6A shows an example of the imaging area divided by concentric circles centered on the middle of the imaging area, while FIG. 6B shows an example of the imaging area divided by rectangles centered on the middle of the imaging area and similar in shape to the external form of the imaging area.

FIG. 7 is a graph illustrating the pitch of the metal layers for ensuring electrical connectivity per sub-area in the case of FIG. 6A. The pitch decreases gradually from sub-area 1 to sub-area 3, as shown in FIG. 7. Also, the values of P1, P2 and P3 in respective sub-areas 1, 2 and 3 are uniform within any one sub-area.

The variation in the angle of incidence of external light is greater the closer the pixel cell is to the middle of the imaging area, and decreases toward the periphery. Given that the metal layers for ensuring electrical connectivity also contribute to the shielding of external light, increasing the pitch in the middle of the imaging area enables the shielding of external light by these metal layers to be reduced, even if the angle of incidence varies greatly.

On the other hand, since the variation in the angle of incidence is small at the periphery of the imaging area, the incidence of external light can be ensured even if the pitch of the metal layers is small.

Embodiment 3

Next, an embodiment 3 of the present invention is described. A MOS image sensor pertaining to the present embodiment is provided with generally the same structure as a MOS image sensor pertaining to embodiment 1, except that the pitch of the metal layers for ensuring electrical connectivity (equivalent to metal layers 406B in embodiment 1) differs depending on location in the imaging area. The present embodiment is described below, focusing exclusively on this difference.

(1) Structure of Pixel Cells

Firstly, the structure of pixel cells provided in a MOS image sensor pertaining to the present embodiment is described.

FIGS. 8A to 8D show the structure of a pixel cell provided in a MOS image sensor pertaining to the present embodiment. FIGS. 8A and 8C are a plan view and a cross-sectional view of the pixel cell located in the middle of the imaging area, while FIGS. 8B and 8D are a plan view and a cross-sectional view of the pixel cell located at the periphery of the imaging area.

As shown in FIGS. 8C and 8D, the pixel cell is provided with a semiconductor substrate 801, insulating films 802, 805 and 808, metal layers 803, 806A and 806B, a contact 804, a color filter 807, a collecting lens 809, and a photodiode 810.

In the middle of the imaging area, the centers of photodiode 810, metal layer 806A, color filter 807 and collecting lens 809 coincide in plan view (FIG. 8C).

On the other hand, at the periphery of the imaging area, the center of metal layer 806A is displaced from the center of photodiode 810 by a distance c, the center of color filter 807 is displaced from the center of photodiode 810 by a distance b, and the center of collecting lens 809 is displaced from the center of photodiode 810 by a distance a (FIG. 8D).

As shown in FIGS. 8A and 8B, the size of metal layer 806B (pattern width d) is small in the middle of the imaging area and large at the periphery. On the other hand, the size of contact 804 (pattern width w) is the same regardless of location in the imaging area.

Furthermore, since the positional relation of photodiode 810 and contact 804 also remains the same regardless of location in the imaging area, the distance from the center of photodiode 810 to the center of metal layer 806A is equal to the distance from the center of contact 804 to the center of metal layer 806A, this being the distance c.

(2) Pattern Width d of Metal Layer 806B

In the present embodiment, the pattern width d of metal layer 806B for ensuring electrical connectivity varies depending on location in the imaging area. The pattern width d is designed using the following equation.

$$d = w + c - (g/2) + a \qquad (2)$$

Here, w is the pattern width of contact 804, c is the distance from the center of photodiode 810 to the center of metal layer 806A, and g is the pattern width of metal layer 406A.

With equation 1 pertaining to embodiment 1, a fixed value $c_{max}$ is used to derive the pattern width d. In contrast, since the distance c used in the present embodiment varies depending on location in the imaging area, the pattern width d also varies depending on location in the imaging area.

The pattern width d in embodiment 1 is thus unnecessarily large the closer the pixel cell is to the middle of the imaging area, whereas in the present embodiment, the shading of incident light by metal layer 406B can be minimized because the pattern width d can be kept to the minimum necessary value per pixel cell.

Accordingly, the present embodiment enables image quality to be further improved.

In equation 2, the value of a is determined such that the pattern width d is greater than or equal to the pattern width g of metal layer 806A, even when the centers of photodiode 810 and metal layer 806A coincide (c=0).

This is due to the risk of positional deviation arising between contact 804 and metal layers 806A and 806B, given that the contact and metal layers are formed in separate processes during manufacturing. In other words, a processing margin is necessary to ensure electrical connectivity between contact 804 and metal layer 806B regardless of positional deviation.

Figure 9A:
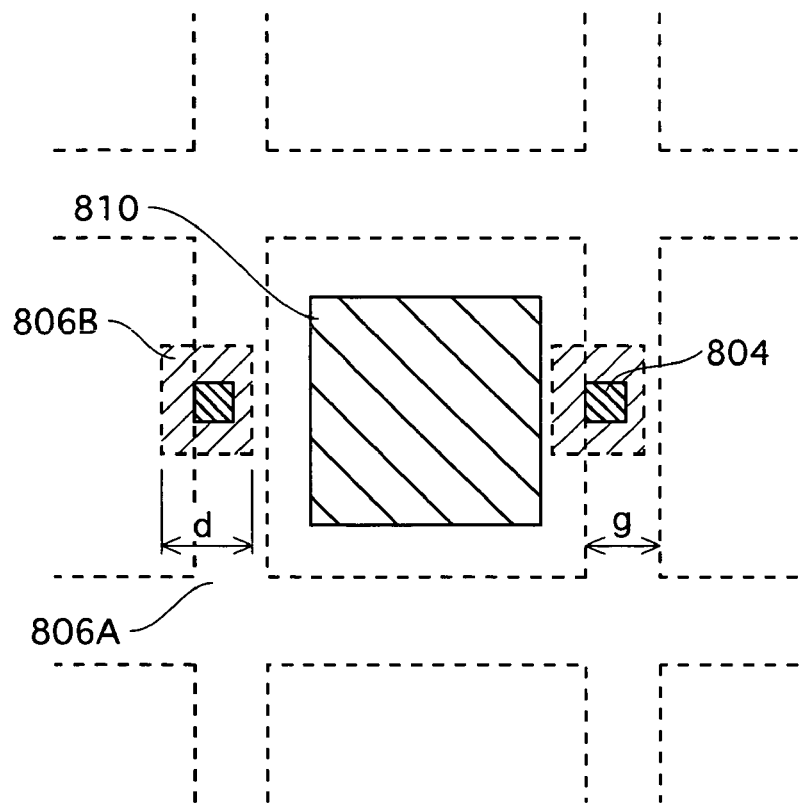
FIGS. 9A and 9B show a pattern width d of a metal layer 806B pertaining to embodiment 3 of the present invention, FIG. 9A being a plan view in the case of positional deviation, and FIG. 9B being a graph showing the relation between the pattern width d and a distance c from a central position of an imaging area.
Figure 9B:
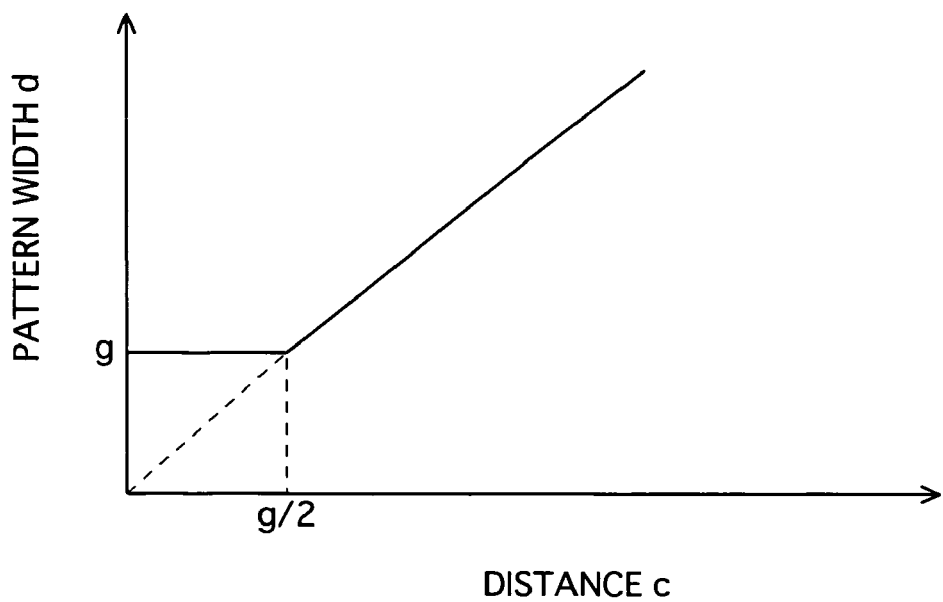

FIGS. 9A and 9B show the pattern width d of metal layer 806B, FIG. 9A being a plan view in the case of positional deviation, and FIG. 9B being a graph showing the relation between the pattern width d and the distance c from a central position of the imaging area.

As shown in FIG. 9A, electrical connectivity between contact 804 and metal layer 806B can be ensured through making the pattern width d a given size even when the distance c is small.

In the present embodiment, the minimum value of the pattern width d is set to the pattern width g of metal layer 806A. Setting the pattern width d to less than the pattern width g does not allow for a significant increase in the amount of received light, and instead makes it more difficult to ensure electrical connectivity. Also, when the distance c exceeds g/2, electrical connectivity cannot be ensured unless the pattern width d is increased.

Thus, the relation between the distance c and the pattern width d is as shown in the FIG. 9B graph. In other words, the pattern width d is equal to the pattern width g when the distance c is g/2 or less, and increases linearly when the distance c is greater than g/2 to give the pattern width d obtained by equation 1 pertaining to embodiment 1.

Note that the distance c in a typical MOS image sensor preferably is approximately 1.0 μm. Also, the positional deviation between contact 804 and metal layer 806B is at most approximately 0.1 μm according to the current standards of typical processing technology.

Embodiment 4

Next, a MOS image sensor pertaining to an embodiment 4 of the present invention is described. A MOS image sensor pertaining to the present embodiment is provided with generally the same structure as a MOS image sensor pertaining to embodiment 1, except for a difference in the positioning of the contact. The present embodiment is described below, focusing on this difference.

(1) Structure of MOS Image Sensor

Figure 10:
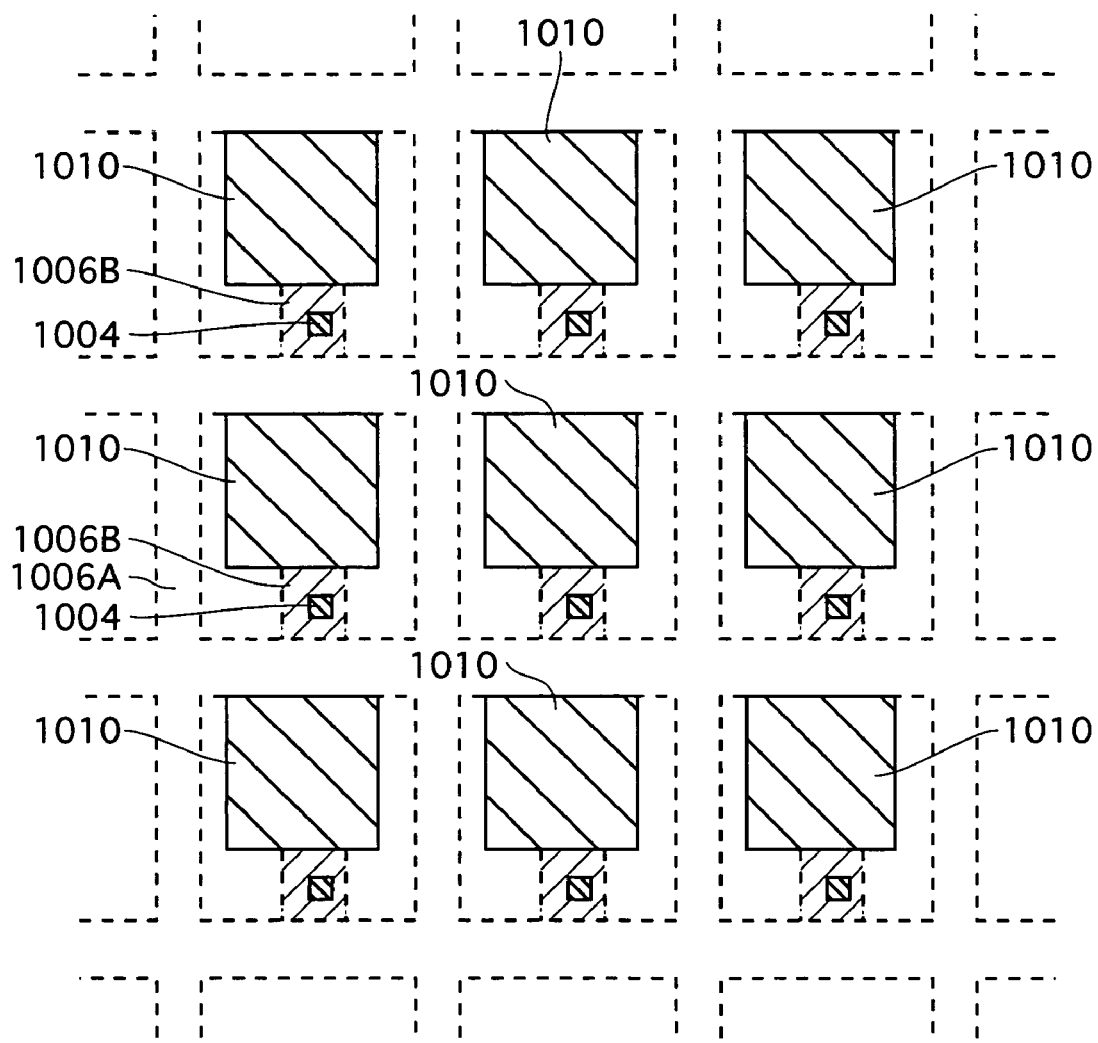
FIG. 10 is a plan view showing the positional relation between photodiodes, contacts, and metal layers pertaining to an embodiment 4 of the present invention.

Firstly, the structure of the MOS image sensor is described. FIG. 10 is a plan view showing the positional relation between photodiodes, contacts, and metal layers. The imaging area of a MOS image sensor pertaining to the present embodiment has a horizontal to vertical pixel ratio of 3:4. In FIG. 10, the "H direction" and "V direction" denote the horizontal and vertical directions, respectively. The "D direction" (not depicted) denotes the diagonal direction.

As shown in FIG. 10A, contacts 1004 and metal layers 1006B are placed at positions sandwiched by adjacent photodiodes 1010 in the V direction.

(2) Effects of Present Embodiment

The angle of incidence of external light on the pixel cells is equal for pixel cells equally distant from the middle of the imaging area, regardless of whether in the vertical or horizontal direction. The angle of incidence is thus maximized at the outer edge in the direction with the greater width, in the case where the widths of the imaging area differ in the vertical and horizontal directions.

To ensure the amount of received light, the distance between the centers of the metal layer and the photodiode needs to be increased the greater the angle of incidence, which consequently means that the pattern width of the metal layer for ensuring electrical connectivity is also increased.

Increasing the pattern width of the metal layer for ensuring electrical connectivity impedes external light incident on the photodiode, which is contrary to the object of ensuring the amount of received light.

In contrast, if the contact and the metal layer for ensuring electrical connectivity are placed between adjacent photodiodes in the direction with the smaller imaging area width (V direction in the present embodiment), the maximum pattern width of this metal layer can be suppressed. Accordingly, image quality can be improved by ensuring the amount of received external light to the photodiode. Higher pixelization can thus be achieved by making the pixel cells even smaller.

Modifications

The present invention, while having been described above based on the preferred embodiments, is of course not limited to these embodiments, and the following modifications may be implemented.

(1) While not particularly addressed in the above embodiments, the metal layer that acts as a light shielding film is not particularly limited in terms of material or the like, provided it functions as a light shielding film and wiring.

Furthermore, the metal layer connected via a contact to the metal layer that acts as a light shielding film may be metal wiring whose primary material is aluminum, tungsten or the like, or may be a transistor gate electrode or a diffusion layer.

Furthermore, provided the contact is also a conductor, a material other than metal may be used, such as a low resistance polysilicon plug, for example.

Although the present invention has been fully described by way of examples with reference to the accompanying drawings, it is to be noted that various changes and modifications will be apparent to those skilled in the art. Therefore, unless such changes and modifications depart from the scope of the present invention, they should be construed as being included therein.

What is claimed is:

1. A MOS-type solid-state imaging device comprising:
   a plurality of photoelectric conversion elements two dimensionally arrayed in an imaging area;
   a light shielding film that is a single film and regulates an amount of external light incident on the photoelectric conversion elements by a wiring pattern;
   a wiring layer placed between the light shielding film and the photoelectric conversion elements in a lamination direction; and
   a plurality of contacts electrically connecting the light shielding film with the wiring layer, wherein
   a shape of the light shielding film is defined by a plurality of first figures combined with a second figure, each first figure being placed over a different contact in plan view, and the second figure having a plurality of apertures each corresponding to a different photoelectric conversion element,
   a center of each aperture in the second figure is displaced further from a center of a corresponding photoelectric conversion element toward a middle of the imaging area in plan view, as distance from the middle of the imaging area increases,
   a positional relation of the first figures with the second figure differs depending on location in the imaging area, and
   the first figures are positioned within the apertures in the second figure on a periphery of the imaging area.

2. The MOS-type solid-state imaging device of claim 1, wherein the displacement of each aperture center from the center of a corresponding photoelectric conversion element increases in proportion to distance from the middle of the imaging area.

3. The MOS-type solid-state imaging device of claim 1, wherein the displacement of each aperture center from the center of a corresponding photoelectric conversion element increases stepwise according to distance from the middle of the imaging area.

4. The MOS-type solid-state imaging device of claim 1, wherein the first figures have substantially similar positional relations with corresponding contacts regardless of location in the imaging area, are substantially similar in size regardless of location in the imaging area, and are large enough to overlap with the second figure at a furthest location from the middle of the imaging area.

5. The MOS-type solid-state imaging device of claim 1, wherein an interval between adjacent first figures interposed with a photoelectric conversion element in plan view increases as distance from the middle of the imaging area increases.

6. The MOS-type solid-state imaging device of claim 5, wherein the imaging area is divided into a plurality of sub-areas, and the interval between adjacent first figures in respective sub-areas is constant.

7. The MOS-type solid-state imaging device of claim 1, wherein each first figure increases in size as distance from the middle of the imaging area increases.

8. The MOS-type solid-state imaging device of claim 7, wherein a pattern width of each first figure in the middle of the imaging area is equivalent to a pattern width of the second figure, in a pattern widthwise direction of the second figure near a contact corresponding to the first figure.

9. The MOS-type solid-state imaging device of claim 1, wherein the imaging area is rectangular, and each first figure is placed adjacent to a closest photoelectric conversion element in a short direction of the imaging area.

* * * * *